United States Patent [19]
Berger et al.

[11] Patent Number: 4,760,558
[45] Date of Patent: Jul. 26, 1988

[54] ANALOG IMAGE MEMORY DEVICE USING CHARGE TRANSFER

[75] Inventors: Jean L. Berger, Grenoble; Louis Brissot, St. Egreve; Yvon Cazaux, Grenoble, all of France

[73] Assignee: Thomson-CSF, Paris, France

[21] Appl. No.: 742,617

[22] Filed: Jun. 7, 1985

[30] Foreign Application Priority Data

Jun. 13, 1984 [FR] France .................................. 84 09202

[51] Int. Cl.$^4$ ..................... H01L 29/78; G11C 11/34; H04N 3/14; H04N 5/335
[52] U.S. Cl. .................................... 365/183; 365/189; 358/213.26; 358/213.29; 357/24
[58] Field of Search ............. 365/45, 183; 357/24 LR; 250/208; 307/304; 358/213, 212

[56] References Cited

U.S. PATENT DOCUMENTS

| | | | |
|---|---|---|---|
| 3,763,480 | 10/1973 | Weimer et al. | 340/173 R |
| 3,914,748 | 10/1975 | Barton et al. | 340/173 R |
| 4,094,009 | 7/1978 | Schneider et al. | 365/183 |
| 4,271,488 | 7/1981 | Saxe | 365/45 |
| 4,336,557 | 7/1982 | Koch | 365/183 |
| 4,493,060 | 2/1985 | Varshney | 365/238 |
| 4,571,624 | 2/1986 | Nishizawa et al. | 358/212 |

FOREIGN PATENT DOCUMENTS 0038725 10/1981 European Pat. Off. .
0060752 9/1982 European Pat. Off. .
0064890 11/1982 European Pat. Off. .

OTHER PUBLICATIONS

IEEE Journal of Solid-State Circuits, vol. SC-11, No. 4, aout 1976, pp. 519-528, New York, U.S.; R. A. Heald et al.: "Multilevel . . . ".
NEC Research and Development, No. 12, Oct. 1968, pp. 29-36, Tokyo, JP; O. Enomoto et al.: "Most Capacitor Memory".

Primary Examiner—Terrell W. Fears
Assistant Examiner—Melissa J. Koval
Attorney, Agent, or Firm—Roland Plottel

[57] ABSTRACT

An analog image memory device using charge transfer and comprising:
  a memory zone of N lines of M memory points, each memory point being formed by the integration on the same semiconductor substrate of an MIS capacity separated from a diode by a screen grid,
  means for selecting each memory point,
  means for writing in each memory point a charge amount corresponding to the analog signal to be stored and
  means for reading the memory zone line by line after writing.

25 Claims, 3 Drawing Sheets

FIG_1 (PRIOR ART)
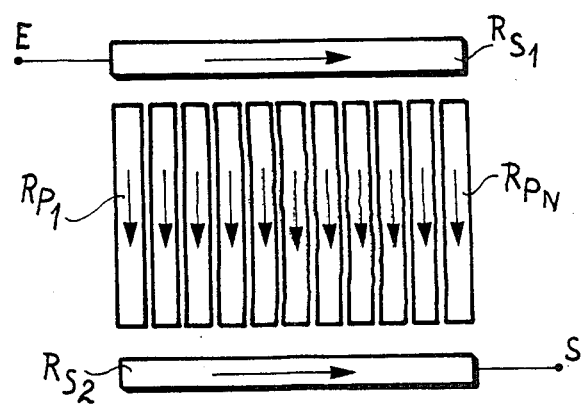
FIG_5
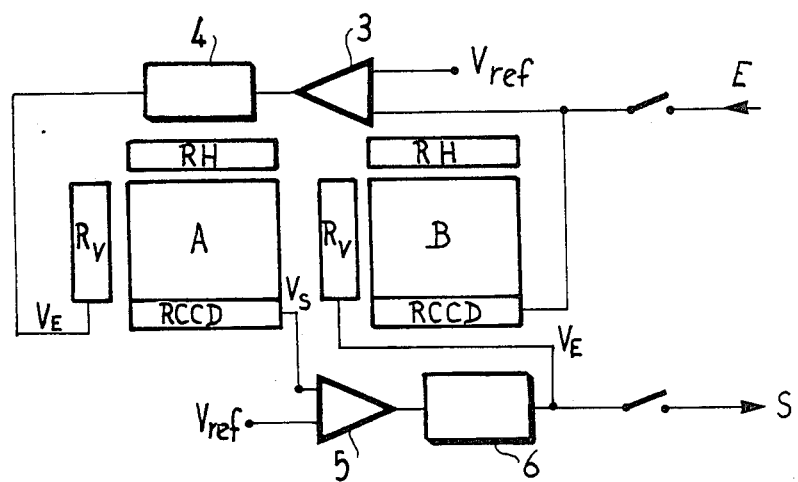

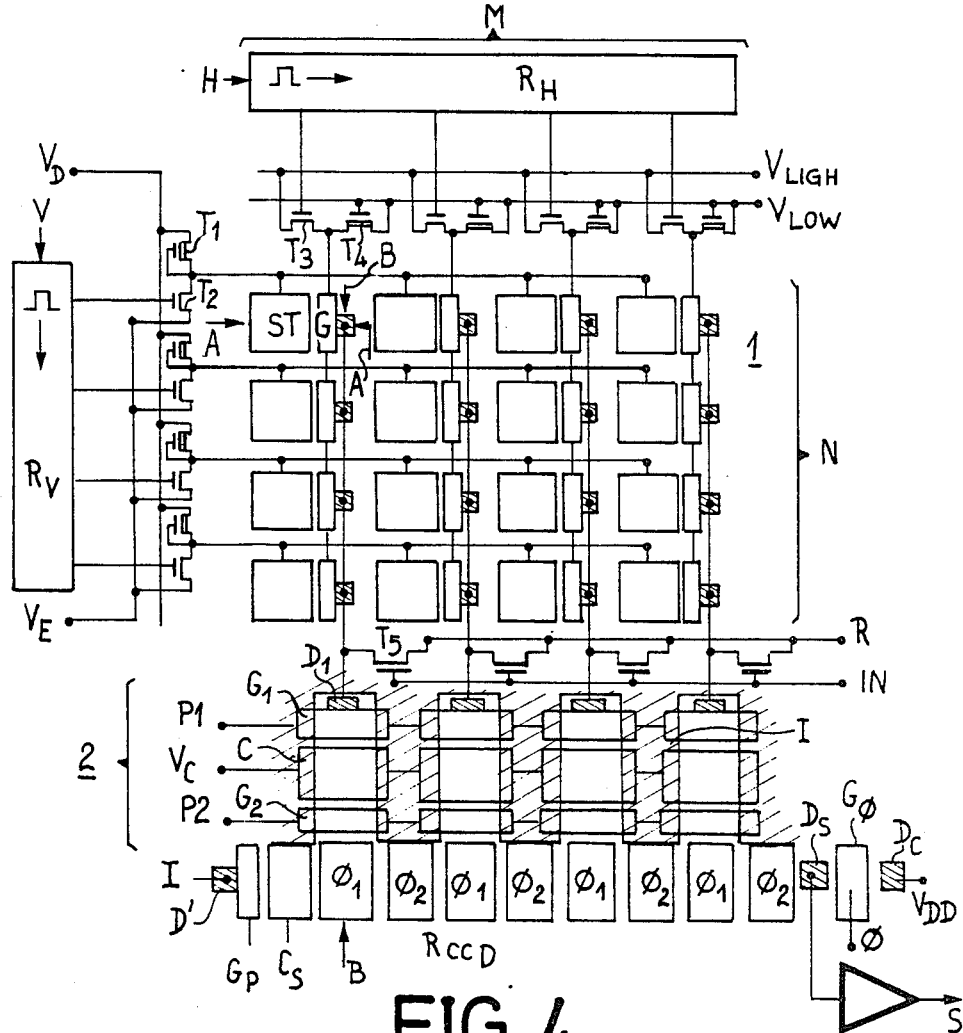
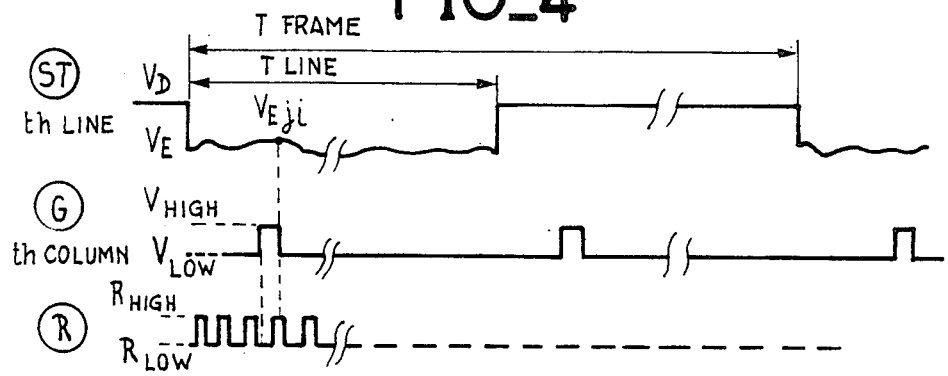

FIG_3-a
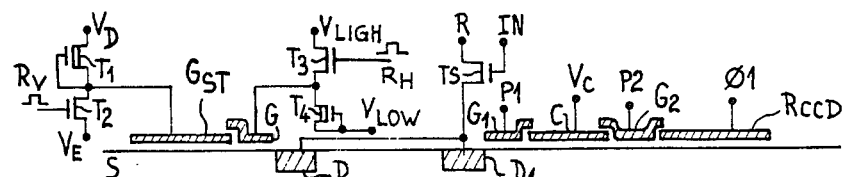
FIG_3-b
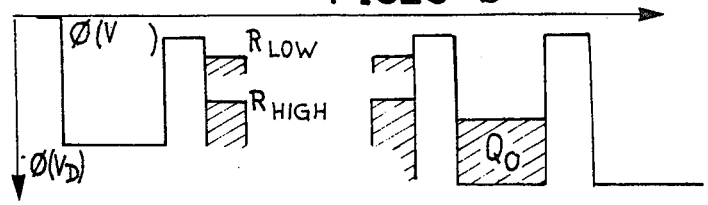
FIG_3-c
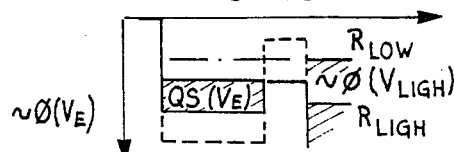
FIG_3-d
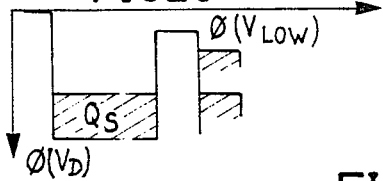
FIG_3-e
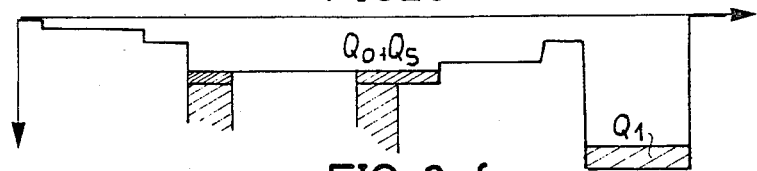
FIG_3-f
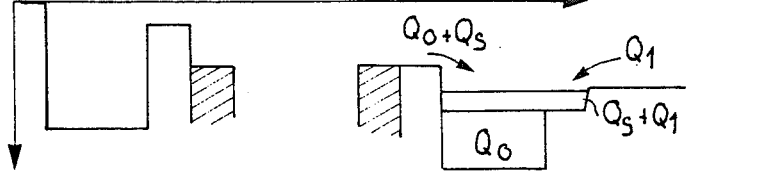
FIG_3-g
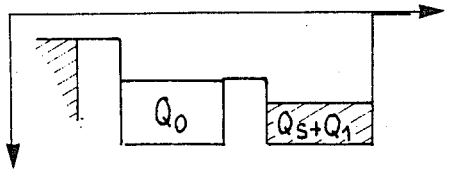

ANALOG IMAGE MEMORY DEVICE USING CHARGE TRANSFER

BACKGROUND OF THE INVENTION

1. Field of the Invention

The present invention relates to an analog image memory device using charge transfer.

2. Description of the Prior Art

At the present time the devices used for storing a video image are either memory tubes or large capacity digital memories. In the case of memory tubes, the information is stored directly in analog form whereas in the case of digital memories, it is necessary to transform the analog information into digital information, which requires very large storage capacity and a number of additional conversion devices. Now, a man skilled in the art knows that charge transfer devices are capable of storing and transporting information in analog form. However, the maximum storage time in a charge transfer device at ordinary temperature is of the order of 20 to 40 ms. Consequently, analog memories capable of storing charge amounts corresponding to the analog signal may be formed using charge transfer technology on condition that the information is cyclically regenerated. Such regeneration may be provided by means of analog-digital and digital-analog converters. It requires the storage of coded analog information, which may be readily obtained in the charge transfer technique by quantifying the charge packets corresponding to the analog information. Thus memories called multi-level analog memories can thus be formed.

As shown in FIG. 1, high capacity charge transfer memories capable of storing a video image at present available on the market are formed by:

- an input register $R_{21}$ of CCD type (charge coupled device) in which the information is introduced serially by successive shifts,
- parallel registers $R_{P1}$ to $R_{PN}$ of CCD type in which the information contained in the input register is transferred simultaneously then shifted successively, and
- an output register $R_{S2}$ of CCD type which receives the information conveyed by the registers in parallel and which transmits it serially by successive shifts to the output of the memory.

The main limitation of a series-parallel-series type organization such as described above is the large number of transfers to be effected on analog information. Consequently, the inefficiencies of the transfer limit to about 3 bits the accuracy of the coding, that is to say to 8 the number of levels stored by a CCD stage.

SUMMARY OF THE INVENTION

The aim of the present invention is consequently to provide a new organization for a high capacity analog memory which does not present these drawbacks.

The present invention provides then an analog image memory device using charge transfer and comprising:

- a memory zone of N lines of M memory points, each memory point being formed by the integration on the same semi conductor substrate of an MIS capacity separated from a diode by a screen gate,
- means for selecting each memory point,
- means for writing in each memory point a charge amount corresponding to the analog signal to be stored, and
- means for reading, line by line, the memory zone after writing.

With this organization, the number of charge transfers is much smaller.

Furthermore, the storage capacity for a given area is greater. In fact, in the prior art there is a limit to the storage capacity of the CCD registers. The result is therefore the possibility of storing a larger number of detectable levels.

BRIEF DESCRIPTION OF THE DRAWINGS

Other features and advantages of the present invention will be clear from reading the description of a preferred embodiment with reference to the accompanying drawings in which:

FIG. 1, already described, is a schematic representation of a charge transfer memory of the prior art, FIG. 2 is a schematical top view of a memory device in accordance with the present invention, FIGS. 3a to 3g are respectively a sectional view through A—A and B—B of FIG. 2 and diagrams illustrating writing into and reading from the memory device, FIG. 4 shows certain control signals able to be applied to the device of FIG. 2, and FIG. 5 is a schematical representation of a permanent memory using the memory device of FIGS. 2 and 3.

In the different Figures, the same references designate the same elements but for the sake of clarity the sizes and proportions of the different elements have not been respected.

DESCRIPTION OF THE PREFERRED EMBODIMENT

As shown more particularly in FIGS. 2 and 3, the memory device in accordance with the present invention comprises essentially:

a memory zone 1;
means for selecting each point of this memory zone;
means for writing into each point of the memory zone;
and means for reading, line by line, the memory zone after writing.

Each of these parts will therefore be described successively and it will be explained how they are connected together.

The memory zone 1 is formed mainly by a matrix of $N \times M$ memory points. In FIG. 2, this matrix comprises four lines and four columns, that is to say sixteen memory points.

Each memory point is formed by the integration on the same semiconductor substrate S, which is generally made from silicon, of an MIS capacity ST formed in a way known per se by the substrate, an isolating layer such as silicon oxide and a gate $G_{ST}$ made from aluminium or polycrystalline silicon.

This capacity ST is associated with a screen gate G which separates it from a diode D used successively as charge injection diode and as reading diode as will be explained in greater detail further on. As is known, diode D is formed by a diffusion of the opposite type to that of the substrate.

As shown in FIGS. 2 and 3, each memory point is connected to means for selecting them. More specifically, the means for selecting each memory point are formed by means addressing and biasing the MIS capacities ST line by line and by means addressing and biasing the screen gates G column by column. Thus, the means for addressing and biasing the storage capacities ST line by line comprise a logic shift register $R_V$ which receives a pulse V which shifts by a step at the line frequency at the time of writing or reading each line. The shift register $R_V$ of series-parallel type comprises N outputs, namely four outputs in the embodiment shown in FIG. 2. Each output is connected to the gate of an MOS transistor $T_2$ one electrode of which, namely the drain in the embodiment shown, is connected to the analog signal to be stored $V_E$ and the other electrode of which, namely the source, is connected to the capacities ST in the same line and to a charge connected depletion transistor $T_1$. Thus, in a way known per se, the drain of the MOS transistor $T_1$ is connected to a biasing voltage $V_D$ brought to a high level and the gate of transistor $T_1$ is connected to its source.

Furthermore, the means for addressing and biasing the screen gates G column by column are formed essentially by a series-parallel logic shift register $R_H$ in which a pulse H is shifted at the point frequency. The M outputs of the register $R_H$ are connected to the gate of a transistor $T_3$, one electrode of which, namely the drain in the embodiment shown, is connected to a biasing voltage $V_{haut}$ and the other electrode, namely the source of transistor $T_3$ is connected respectively to the N screen gates G in the same column and to a MOS depletion transistor $T_4$ whose gate and one electrode, namely the drain, are connected to a biasing voltage $V_{bas}$.

Furthermore, the means for writing in each memory point for writing a charge amount corresponding to the analog signal to be stored are formed essentially by MOS transistors $T_5$ whose gate is connected to a potential IN brought to the high level solely during the writing sequence. Moreover, the drain of the MOS transistors $T_5$ in the embodiment shown is connected to a periodic potential R which alternates between a low level and a high level at the point frequency and the source of the transistors $T_5$ is connected to the N diodes of each column.

In addition, the memory device of the present invention comprises means for reading the memory zone line by line after it has been written. These means are formed essentially by a line memory 2 associated with a charge transfer shift register $R_{CCD}$ having parallel inputs and a series output. More specifically, the line memory comprises M storage capacities C connected to a periodic potential $V_C$ and separated by a passage gate $G_1$ from a reading diode $D_1$ which is connected by a connection to the N diodes D of the same column. Moreover, the gate $G_1$ is brought to a potential $P_1$ allowing the charges stored in each memory point in the same line to pass to the storage capacities C at the beginning of the reading sequence as will be explained in greater detail hereafter. Furthermore, the storage capacities C of the line memory are separated by a passage gate $G_2$ brought to an alternating potential $P_2$ from the M input stages of the shift register $R_{CCD}$. The reading shift register shown in FIG. 2 is a register having two control phases $\phi_1$ and $\phi_2$. This register is formed in a way known per se by storage and charge transfer electrode pairs, connected successively to $\phi_1$ and $\phi_2$. As shown in FIG. 2, the storage electrodes connected to $\phi_1$ are in communication with the capacities C whereas isolating barriers I are provided opposite the electrode pairs coupled to $\phi_2$, and separate the different storage capacities C from each other. Furthermore, the output of the register $R_{CCD}$ is connected to a reading stage properly speaking. This stage is a stage providing destructive reading on a floating diode and it is formed essentially by a diode $D_S$, a gate $G_\theta$ connected to a potential $\phi$ and a diode $D_C$ biased by a DC voltage $V_{DD}$, the diode $D_S$ being further connected to an amplifier delivering the stored analog signal S.

Furthermore, in order to be able to use driving charges during reading, which improves the transfer efficiency of the stored charges from the conducting columns connecting the memory points together to the reading register $R_{CCD}$, a charge injection device is provided upstream of the register $R_{CCD}$. This charge injection device is formed from a diode D', a gate $G_P$ and a storage gate $C_S$. It allows the injection of the same driving charge $Q_1$ in all the stages of the register $R_{CCD}$, the role of such a driving charge being explained in greater detail further on.

The writing and reading sequences of the above-described memory device will now be explained with reference more particularly to FIGS. 3b to 3g and to FIG. 4. FIG. 4 is a diagram with respect to time of the signal applied to a line and a column during the writing sequence. The signals of the reading sequence have not been shown for they are conventional, the reading process used being similar to the reading process used in so-called line transfer photosensitive devices.

During the writing sequence, two successive operations are performed:
  addressing of a memory point,
  injection into the memory point of a charge amount proportional to the analog signal to be stored.

During the whole writing sequence, the MOS transistors $T_5$ are enabled by applying to their gate a potential IN brought to a high level.

Thus, the signal R is then permanently applied to the columns. As shown in FIG. 4, the signal R is a periodic signal varying between a low level $R_{bas}$ and a high level $R_{haut}$ at the point frequency.

Furthermore, the analog signal to be stored is permanently applied to the input connection $V_E$. During the writing sequence, the reading assembly formed by the line memory 2 and register $R_{CCD}$ is latched by bringing the potential $P_1$ applied to the grid $G_1$ to a low level. Furthermore, the reading register $R_{CCD}$ is not operating.

The potential profile will first of all be given under a memory point in which neither the line nor the column are addressed, with reference to FIG. 3b. In this case, the capacity ST is brought to the potential $V_D$ by the depletion MOS transistor $T_1$ for the MOS transistor $T_2$ is then disabled, a "0" level being applied also to its gate. Similarly, the gate G is brought to the potential $V_{bas}$ by the depletion MOS transistor $T_4$ for the MOS transistor $T_3$ is then disabled, a level "0" being also applied to its gate. The result is that the potential well given by $\phi$ ($V_D$) under the capacity ST is isolated by the potential barrier $\phi$ ($V_{bas}$) under the gate G of the diode D whose potential fluctuates between $R_{bas}$ and $R_{haut}$ while following the potential of R as shown in FIG. 3b.

During the different writing sequences, the potentials $P_1$ and $P_2$ are at low levels whereas the potential $V_C$ is at a high level and the potential profiles are obtained which are shown in the right hand part of FIG. 3b corresponding to the right hand part of FIG. 3a.

When a line is selected, i.e. when the pulse V is applied to the gate of transistor $T_2$ connected to the capacities ST of said line, the potential of this line substantially follows the input voltage $V_E$ applied through the MOS transistor $T_2$ as shown in FIG. 4. Consequently, all the memory points ST of the line follow the voltage $V_E$.

When a point in a line is selected, i.e. when the gate of the MOS transistor $T_3$ of the column of the point receives the pulse H, the capacity ST receives the voltage $V_E$ and the gate G is connected to $V_{haut}$ through the transistor $T_3$. It will be noted that the MOS transistors $T_2$ and $T_3$ are much more conducting than the MOS transistors $T_1$ and $T_4$, which provides the voltages $V_E$ and $V_{haut}$ at the output when the transistors $T_2$ and $T_3$ are enabled.

When the voltage $V_{haut}$ is applied to the gate G, the voltage R is at the low level as shown in FIG. 4 and diode D injects charges under the selected capacity ST while imposing the level $R_{bas}$ as shown in FIG. 3c. Then, the voltage R passes to the high level and the diode D removes the charge excess with respect to the potential barrier under G given by $\phi$ ($V_{haut}$). A charge amount $Q_S(V_E)$ proportional to $V_E$ which fixes the potential well under the gate $G_{ST}$ is then injected into the capacity ST in accordance with the injection method called "fill and spill" or method of injection by skimming the potential well.

In fact, the charge amount $Q_S(V_E)$ injected in this way is only sensitive to the relative threshold variations under the screen gate $G_E$ and gate $G_{ST}$ of the storage capacity. Since these two gates are very close, if they are formed in the same oxide thickness, the influence of the threshold variations is negligble Thus, for the same voltage $V_E$, the variations of the charge $Q_S$ from one memory point to another depend solely on the capacity variations and so on the technological construction conditions.

If $\Delta Q_S$ is the maximum variation on an injected charge $Q_S(V_E)$ for a constant input voltage $V_E$ at all the memory points, the information cannot be read better than to the nearest $\Delta Q_S$. The maximu number of levels which can then be distinguished and regenerated on the memopry point is written:

$$N = \frac{Q_{max}}{2 \times \Delta Q_S}$$

For example, if the memory point is capable of storing $Q_{max} = 10^6$ electrons with a variation $\Delta Q_S$ of $10^4$ electrons (1%), the number of detectable levels is $N=50$, which means that $2^5=32$ levels or 5 bits, may be stored with sufficient safety.

The reading and transfer noise by line transfer is of the order of 500 electrons, this noise is therefore negligble compared with the noise $\Delta Q_S$ and does not affect the number of storable levels.

Once the column has been written, the potential on the screen gate G is brought back to $V_{bas}$ and once the whole of the line has been written, the potential applied to the gate $G_{ST}$ is brought back to $V_D$. Thus, we find again the situation shown in FIG. 3d.

The reading sequence will now be described with reference to FIGS. 3e to 3g. This is effected for the whole of a line selected by the vertical register $R_V$. During the reading sequence, the MOS transistor $T_5$ is disabled, the potential IN being at the low level. The level $V_{bas}$ is applied to the gates G for the horizontal register $R_H$ is not operating.

For reading the signal charges stored in the memory points a double driving charge is used, namely a charge $Q_O$ which was stored and which is held under the capacities C of the line memory and a charge $Q_1$ which was injected prior to reading in the reading register $R_{CCD}$.

As shown in FIG. 3e, a potential is applied to the input $V_E$ at a low level less than $\phi$ ($V_{bas}$) so that, when the line is selected, the signal charges $Q_S$ stored in the memory point ST flow over the potential barrier under the screen gate G to the reading diode D where they are added to the driving charge $Q_O$, for simultaneously the potential $V_C$ applied to the storage capacity C is brought to a low level whereas the potential $P_1$ applied to the gate $G_1$ is brought to a high level.

Then, the signal charge plus driving charge $Q_S + Q_O$ is transferred under the capacity C whose potential $V_C$ is brought back to a high level. Then the potential $P_2$ is brought to a high level and potential $\phi_1$ to a low level for transferring the second drive charge $Q_1$ from the register CCD under the capacity C. The high level of potential $P_2$ is chosen so as to maintain under the capacity C solely the driving charge $Q_O$ as is shown in FIG. 3f. Then, the potential $Q_1$ is brought to the high level and the charge $Q_S + Q_1$ is transferred into the corresponding stage of the register $R_{CCD}$, as shown in FIG. 3g. The potential $P_2$ is then brought to a low level and the register $R_{CCD}$ effects the transfer of the charges $Q_S + Q_1$ to the reading stage in a way known per se.

In the embodiment described above a reading process with two drive charges is used, however it is obvious to a man skilled in the art that other reading processes identical to the processes for reading a photosensitive device of the line transfer type may be used without departing from the scope of the invention. The result is that the structure of the line by line reading means may also be modified without departing from the scope of the invention.

The above described memory device comprises at the output of the reading register CCD a comparator which detects the levels and regenerates them for supplying the stored analog signal. Consequently, to respect the number of levels, the vertical transfer inefficiency must be less than 1/2N.

To construct a permanent memory whose storage time is greater than 40 milliseconds, two memory devices such as described above are required. These memory devices work alternately for reading and writing for the two operations are not simultaneous. The two memory devices are assembled together in the way shown in FIG. 5.

The analog information E is introduced through N comparators 3 which code it in N levels by the regeneration device 4 which thus loads the memory A. This latter is then read and simultaneously loads the memory B through N comparators 5 and a device for regenerating the levels 6 then B reloads A and so on.

What is claimed is:
1. A memory device for storing a video signal in analog form using charge transfer comprising:
   a memory zone (1) or N lines and M columns of memory points, each memory point being formed by the integration on the same semiconductor substrate of a MIS capacitor (ST) separated from a diode (D) by a screen gate (G),
   addressing means (RV, RH) connected respectively to each line and each column of memory points for selecting each memory point individually,
   writing means (T5, VE, R, T1, T2) connected to each memory point for writing in turn in the MIS capac- itor of each individual memory point selected by the addressing means a charge amount corresponding to an analog signal (VE) to be stored, and charge reading means (2, RCCD) connected to each column for reading the memory zone line by line after writing.

2. The memory device as claimed in claim 1, wherein said addressing means comprise means (R, T1, T2) for applying a potential on the MIS capacitors line by line and means for applying a potential on the screen gates column by column.

3. The memory device as claimed in claim 2, wherein said means for applying a potential on the MIS capacitors line by line comprise a logic shift register (RV) with N outputs, each output being connected to the gate of a MOS transistor (T2) one electrode of which is connected to a load (T2) biased to a high level and to the MIS capacitors (ST) of the same line and the other electrode of which receives the analog signal (VE) to be stored.

4. The memory device as claimed in claim 2, wherein said means for applying a potential on said screen gates column by column comprise a logic shift register (RH) with M outputs, each output being connected to the gate of a MOS transistor (T3) one electrode of which is connected to a load (T4) imposing a low level potential and to the screen gates of the same column and the other electrode of which receives a high level potential.

5. The memory device as claimed in claim 1, wherein said writing means are formed by devices allowing charge injection by skimming the potential well created under the MIS capacitors.

6. The memory device as claimed in claim 5, wherein said writing means comprise MOS transistors (T5) addressing each column of diodes whose gate is connected to a periodic potential enabling the MOS transistors during the writing sequence and one electrode of which receives a periodic signal varying between a high level and a low level at the point frequency.

7. The memory device as claimed in claim 1, wherein said means for reading the memory zone line by line after writing are formed by a memory of M points, called line memory, each point of which is connected to N diodes (D) of the same and by an analog shift register ($R_{CCD}$) receiving in parallel the charges supplied by the line memory and delivering them in series to a reading stage delivering the previously stored analog signal.

8. The memory device as claimed in claim 7, wherein the line memory is formed by M storage capacities (C), each capacitor being connected on the one hand to the N diodes (D) of the same column through a reading diode (D1) and a passage gate (C1) brought to a high level during the reading sequence and on the other hand to an input of the analog shift register ($R_{CCD}$) through a second passage gate (C2) connected to a periodic potential.

9. The memory device as claimed in claim 7, further comprising means (D', $G_p$, $C_s$) for injecting drive charges into the line memory.

10. The memory device as claimed in claim 8, further comprising means (D', $G_p$, $C_s$) for injecting drive charges into the line memory.

11. The memory device as claimed in claim 9, wherin a device for injecting a charge in series is associated with the analog shift register.

12. The memory device as claimed in claim 10, wherein a device for injecting a charge in series is associated with the analog shift register.

13. The memory device as claimed in claim 1, wherein the analog signal to be stored in an analog signal coded on several levels.

14. A circulating memory formed by two memory devices as claimed in claim 1, the output of each memory device being connected to the input of the other memory device by means of a device for regenerating the levels.

15. A memory device for storing a video signal in analog form using charge transfer comprising:
a memory zone (1) or N lines and M columns of memory points, each memory point being formed by the integration on the same semiconductor substrate of a MIS capacitor (ST) separated from a diode (D) by a screen gate (G),
a logic shift register (RV) with N outputs, each output being connected to the gate of a MOS transistor (T2) one electrode of which is connected to a load (T1) biased to a high level and to the MIS capacitors (ST) of the same line and the other electrode of which receives the analog signal (VE) to be stored,
a logic shift register (RH) with M outputs, each output being connected to the gate of a MOS transistor (T3) one electrode of which is connected to a load (T4) imposing a low level potential and to the screen gates of the same column and the other electrode of which receives a high level potential,
writing means (T5, VE, R, TI, T2) connected to each memory point for writing in the MIS capacitor of an individual memory point selected by the addressing means a charge amount corresponding to an analog signal (VE) to be stored, and
a charge reading means (2, RCCD) connected to each column for reading the memory zone line by line after writing.

16. The memory device as claimed in claim 15, wherein said writing means are formed by devices allowing charge injection by skimming the potential well created under the MIS capacitors.

17. The memory device as claimed in claim 16, wherein said writing means comprise MOS transistors (T5) addressing each column of diodes whose gate is connected to a periodic potential enabling the MOS transistors during the writing sequence and one electrode of which receives a periodic signal varying between a high level and a low level at the point frequency.

18. The memory device as claimed in claim 15, wherein said means for reading the memory zone line by line after writing are formed by a memory of M points, called line memory, each point of which is connected to N diodes (D) of the same and by an analog shift register (RCCD) receiving in parallel the charges supplied by the line memory and delivering them in series to a reading stage delivering the previously stored analog signal.

19. The memory device as claimed in claim 18, wherein the line memory is formed by M storage capacities (C), each capacitor being connected on the one hand to the N diodes (D) of the same column through a reading diode (D1) and a passage gate (C1) brought to a high level during the reading sequence and on the other hand to an input of the analog shift register (RCCD) through a second passage gate (C2) connected to a periodic potential.

20. The memory device as claimed in claim 18, further comprising means (D1, Gp, CS) for injecting drive charges into the line memory.

21. The memory device as claimed in claim 19, further comprising means (D1, Gp, CS) for injecting drive charges in the line memory.

22. The memory device as claimed in claim 20, wherein a device for injecting a charge in series is associated with the analog shift register.

23. The memory device as claimed in claim 21, wherein a device for injecting a charge in series is associated with the analog shift register.

24. The memory device as claimed in claim 15, wherein the analog signal to be stored is an analog signal coded on several levels.

25. A circulating memory formed by two memory devices as claimed in claim 16, the output of each memory device being connected to the input of the other memory device by means of a device for regenerating the levels.

* * * * *